(12) United States Patent
Komatsuda

(10) Patent No.: US 8,467,032 B2
(45) Date of Patent: Jun. 18, 2013

(54) EXPOSURE APPARATUS AND ELECTRONIC DEVICE MANUFACTURING METHOD

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 323 days.

(21) Appl. No.: 12/320,942

(22) Filed: Feb. 9, 2009

(65) Prior Publication Data
US 2009/0257042 A1 Oct. 15, 2009

Related U.S. Application Data

(60) Provisional application No. 61/071,046, filed on Apr. 9, 2008.

(51) Int. Cl.
*G03B 27/52* (2006.01)
(52) U.S. Cl.
USPC .................................. 355/53; 355/77; 378/34
(58) Field of Classification Search
USPC .............................. 378/34; 355/53, 67, 71, 77
See application file for complete search history.

(56) References Cited

U.S. PATENT DOCUMENTS

| | | | |
|---|---|---|---|
| 4,598,197 A | 7/1986 | Morita et al. | |
| 6,452,661 B1 | 9/2002 | Komatsuda | |
| 6,522,390 B2* | 2/2003 | Suzuki et al. | 355/53 |
| 7,023,524 B2* | 4/2006 | Van Dijsseldonk et al. | 355/55 |
| 7,224,438 B2* | 5/2007 | Ottens et al. | 355/67 |
| 7,362,413 B2* | 4/2008 | Kremer et al. | 355/30 |
| 7,551,263 B2* | 6/2009 | Gruner et al. | 355/71 |
| 2001/0002155 A1 | 5/2001 | Takahashi et al. | |
| 2004/0114121 A1* | 6/2004 | Nishi et al. | 355/67 |
| 2004/0189967 A1* | 9/2004 | Ottens et al. | 355/67 |
| 2006/0126036 A1* | 6/2006 | Kremer et al. | 355/30 |
| 2006/0176461 A1 | 8/2006 | Sekine | |
| 2007/0258076 A1* | 11/2007 | Derksen et al. | 355/67 |
| 2009/0208878 A1* | 8/2009 | Loopstra et al. | 430/322 |

FOREIGN PATENT DOCUMENTS

| | | |
|---|---|---|
| EP | 1 431 829 A1 | 6/2004 |
| EP | 1 544 678 A1 | 6/2005 |
| JP | 2003-151880 | 5/2003 |
| JP | 2005-108934 | 4/2005 |

OTHER PUBLICATIONS

U.S. Appl. No. 61/071,046, filed Apr. 9, 2008, Komatsuda, Nikon Corporation.
Ota K et al., "Feasibility Study of EUV Scanners", Proceedings of the SPIE, the International Society for Optical Engineering, Bellingham WA, vol. 4343, Feb. 27, 2001, pp. 60-69.
International Search Report mailed of Aug. 11, 2009 and issued in corresponding International Patent Application PCT/JP2009/001508.

\* cited by examiner

*Primary Examiner* — Thomas R Artman

(57) ABSTRACT

An exposure apparatus including a field stop is provided. The exposure apparatus includes an illumination optical system that guides light from a light source to a pattern forming section, a projection optical system that projects, onto an exposed surface, a pattern image formed by the pattern forming section with light from the illumination optical system, a driving section that moves, in a scanning direction, a substrate arranged on the exposed surface, and a block section that is disposed between the projection optical system and the exposed surface, where the block section has a scanning window that determines a width, in the scanning direction, of an exposure region exposed to light projected by the projection optical system.

27 Claims, 8 Drawing Sheets

EXPOSURE APPARATUS AND ELECTRONIC DEVICE MANUFACTURING METHOD

U.S. Provisional Patent Application No. 61/071,046 filed on Apr. 9, 2008

BACKGROUND

1. Technical Field

The present invention relates to an exposure apparatus and an electronic device manufacturing method. More particularly, the present invention relates to an exposure apparatus including a field stop and to an electronic device manufacturing method performed by using the exposure apparatus. The present application is related to and claims priority from the following U.S. Provisional Patent Application, the contents of which are incorporated herein by reference.

2. Description of the Related Art

An exposure apparatus used for lithography irradiates, via an illumination optical system, a reticle with light generated by a light source, which is referred to as illumination light. The illumination light is transmitted through or reflected by the reticle. A substrate such as a silicon wafer is then irradiated, via a projection optical system, with the light transmitted through or reflected by the reticle, which is referred to as exposure light. In this manner, a photosensitive material applied to the substrate is exposed to light.

For exposure apparatuses, there is a demand for improved resolution as finer circuit patterns are desired. Therefore, the wavelength of the exposure light increasingly becomes shorter. The term "light" in the present specification refers to not only visible light but also electromagnetic waves having a wavelength shorter than 1 mm, in other words, including infrared rays and X rays. In recent years, exposure apparatuses using Extreme Ultraviolet (EUV) light having a wavelength of approximately 5 to 40 nm (hereinafter referred to as Extreme UltraViolet Lithography (EUVL) exposure apparatuses) have been suggested as next-generation apparatuses.

For such a very short wavelength range of EUV light, no existing materials have a sufficient transmittance to be used as refractive optical members. Therefore, a projection optical system used in an EUVL exposure apparatus comprises only reflective optical members. Since an EUVL exposure apparatus uses not a transmissive mask but a reflective mask, the illumination light needs to enter the mask (or reticle) at an angle for the following reason. When the illumination light vertically enters the reflective mask, the optical path of the illumination light that enters the mask overlaps the optical path of the illumination light that is reflected by the mask to be directed towards the projection optical system. Consequently, the optical members of the illumination optical system, which are configured to illuminate the mask, block the optical path of the projection optical system, or the optical members of the projection optical system block the optical path of the illumination optical system.

An EUVL exposure apparatus only provides a narrow and long arc-like effective exposure region (i.e., stationary exposure region) through a reflective projection optical system. For this reason, the mask pattern is transferred onto the photosensitive substrate in a scanning manner while the mask and the photosensitive substrate are moved relative to the projection optical system (a scanning exposure technique). Therefore, a field stop needs to be provided to define the stationary exposure region at a position that is substantially optically conjugated with the photosensitive substrate. In a conventional EUVL exposure apparatus, a field stop is disposed in the optical path of the illumination optical system, and an image-formation catoptric optical system is provided between the mask and the field stop. In this manner, the field stop is positioned so as to be optically conjugated with the mask (and consequently with the photosensitive substrate) (See U.S. Pat. No. 6,452,661).

Generally, the EUVL exposure apparatus exhibits a relatively low reflectance at each reflection surface. Therefore, in order to prevent loss of light and improve the throughput, it is desired to minimize as much as possible the number of reflections the light undergoes while traveling through the illumination and projection optical systems between the light source and the photosensitive substrate. Because of the image-formation catoptric optical system between the mask and the field stop as described above, however, the conventional EUVL exposure apparatus suffers from a relatively large number of reflections in the optical path of the illumination optical system. As a result, the conventional EUVL exposure apparatus experiences a large loss of light and thus cannot achieve the desired throughput.

To reduce the number of reflections in the optical path of the illumination optical system and thus achieve the desired throughput, the field stop may be positioned in the vicinity of the reflective mask (see Japanese Patent Application Publication No. 2005-108934).

When a foreign object is attached to the surface of a reticle of an exposure apparatus, all of the patterns transferred with the use of the reticle have a shadow of the foreign object. As a result, the product yield becomes significantly low. To prevent this problem from happening, an optically transparent film, which is referred to as a pellicle, may be provided so as to surround the reticle and catch foreign objects. Since the pellicle is distant from the surface of the reticle, no images of the foreign objects caught by the pellicle are present in the pattern image of the exposure light. If the pellicle is provided in the proximity of the surface of the reticle, however, it becomes difficult to position a field stop in the vicinity of the reticle.

SUMMARY

In light of the above, it is an object of an aspect of the innovations herein to improve the product yield and throughput. The above and other objects can be achieved by combinations described in the independent claims. The dependent claims define further advantageous and exemplary combinations of the innovations herein.

A first embodiment of the present invention provides an exposure apparatus including a projection optical system that images a pattern, formed by a pattern forming section, onto an exposed surface, a driving section that moves in a scanning direction a substrate arranged on the exposed surface, and a block section that is disposed between the projection optical system and the exposed surface, where the block section has a scanning window that determines a width, in the scanning direction, of an exposure region exposed to light projected by the projection optical system.

A different example of the first embodiment provides an exposure apparatus including an illumination optical system that guides light from a light source to a pattern forming section, a projection optical system that images a pattern, formed by the pattern forming section, onto an exposed surface with light from the illumination optical system, a driving section that moves, in a scanning direction, a substrate arranged on the exposed surface, and a block section that is disposed between the projection optical system and the exposed surface, where the block section has a scanning window that determines a width, in the scanning direction, of an exposure region exposed to light projected by the projection optical system.

A second embodiment of the present invention provides an electronic device manufacturing method including imaging a pattern, formed by a pattern forming section, onto an exposed surface by using a projection optical system, moving in a scanning direction a substrate arranged on the exposed surface by using a driving section, determining a width, in the scanning direction, of an exposure region exposed to light projected by the projection optical system by causing the light projected by the projection optical system to pass through a scanning window, exposing the substrate arranged on the exposed surface to the light from the projection optical system, developing the substrate onto which the pattern is imaged and forming on a surface of the substrate a layer shaped in accordance with a predetermined pattern, and a step of processing the surface of the photosensitive substrate by using the layer.

A different example of the second embodiment provides an electronic device manufacturing method including guiding light from a light source to a pattern forming section by using an illumination optical system, a step of imaging a pattern, formed by the pattern forming section, onto an exposed surface by using a projection optical system, moving in a scanning direction a substrate arranged on the exposed surface by using a driving section, determining a width, in the scanning direction, of an exposure region exposed to light projected by the projection optical system by causing the light projected by the projection optical system to pass through a scanning window, a step of exposing the substrate arranged on the exposed surface to the light from the projection optical system, developing the substrate onto which the pattern is imaged and forming on a surface of the substrate a layer shaped in accordance with a predetermined pattern, and processing the surface of the photosensitive substrate by using the layer. A third embodiment of the present invention provides an exposure method including imaging a pattern formed by a pattern forming section onto an exposed surface by using a projection optical system, moving in a scanning direction a substrate arranged on the exposed surface by using a driving section, determining a width, in the scanning direction, of an exposure region exposed to light projected by the projection optical system by causing the light projected by the projection optical system to pass through a scanning window, and exposing the substrate arranged on the exposed surface to the light from the projection optical system.

A different example of the third embodiment provides an exposure method including guiding light from a light source to a pattern forming section by using an illumination optical system, imaging a pattern formed by the pattern forming section onto an exposed surface by using a projection optical system, moving in a scanning direction a substrate arranged on the exposed surface by using a driving section, determining a width, in the scanning direction, of an exposure region exposed to light projected by the projection optical system by causing the light projected by the projection optical system to pass through a scanning window, and exposing the substrate arranged on the exposed surface to the light from the projection optical system.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiments are not necessarily essential to the invention.

Figure 1:
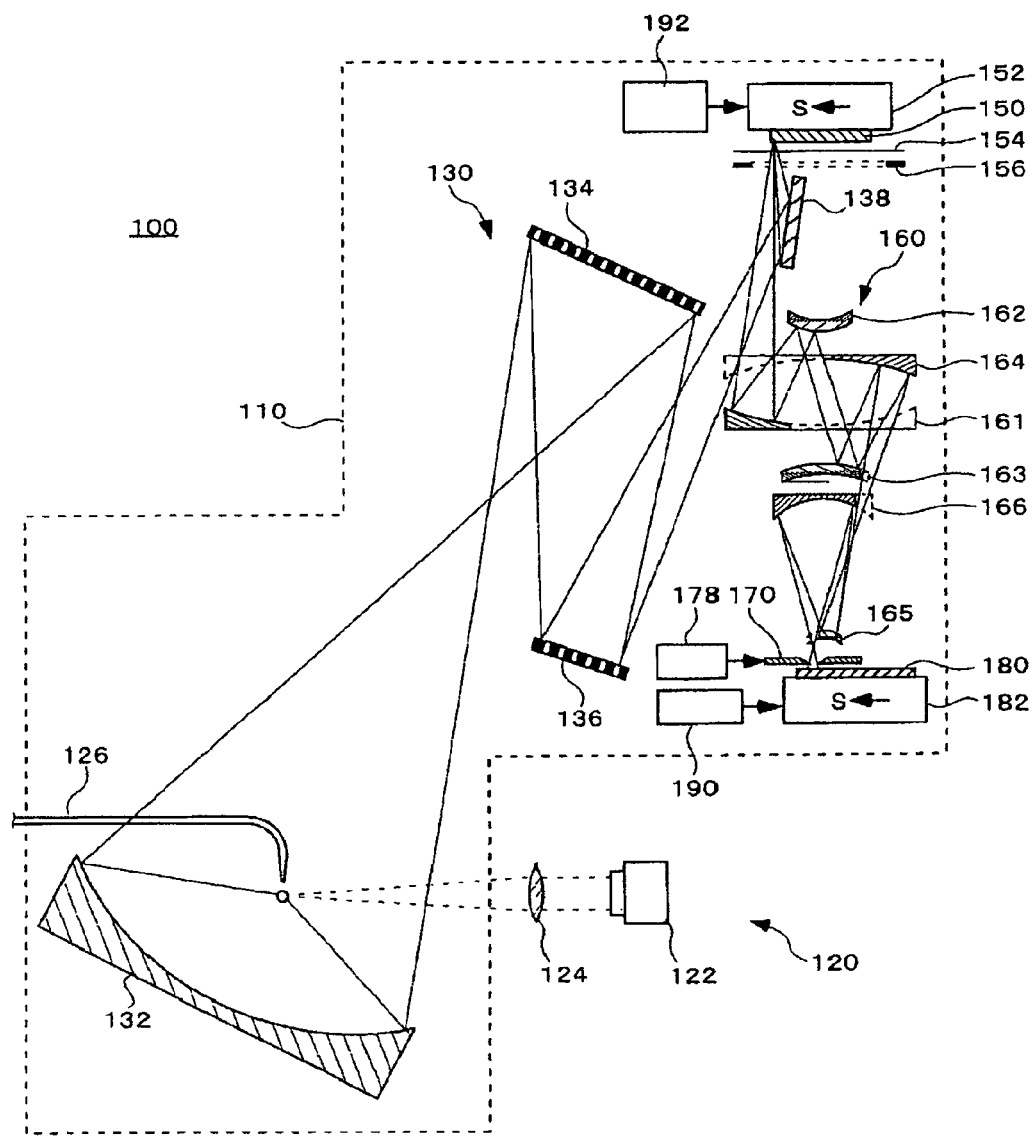
FIG. 1 schematically illustrates the configuration of an exposure apparatus 100.

FIG. 1 schematically illustrates the overall configuration of an exposure apparatus 100. The exposure apparatus 100 includes an illumination optical system 130, a reticle stage 152, a projection optical system 160, a field stop 170 and a substrate stage 182.

While most of the constituents of the exposure apparatus 100 are arranged within an air-tight vacuum chamber 110, some of the components of a light source section 120 are provided outside the vacuum chamber 110. The following description may include such words as "on", "above", "under", "below", "upper" and "lower", which correspond to the positional relations in the drawing. However, the layout within the exposure apparatus 100 is not limited to the shown example.

The light source section 120 provides the exposure apparatus 100 with a light beam of Extreme Ultraviolet (EUV) light. The light source section 120 includes a laser apparatus 122, a collective lens 124, a target nozzle 126 and a collective reflector mirror 132. The laser apparatus 122 generates laser light, and emits the generated laser light towards the inside of the vacuum chamber 110 via the collective lens 124.

The target nozzle 126 has its top end positioned within the vacuum chamber 110 and discharges a gaseous or liquid target material from the top end. The collective reflector mirror 132 has a reflective surface whose cross-section is an elliptic arc. The collective reflector mirror 132 is positioned such that the laser light is irradiated to the target material at a location overlapping a focal point of the elliptic arc.

The target nozzle 126 intermittently discharges the target material. The laser light emitted from the laser apparatus 122 is made convergent by the collective lens 124 and irradiates the discharged target material at a high intensity. In this manner, the plasmatized target material emits pulse-like EUV rays. The emitted EUV rays are collected by the collective reflector mirror 132 to be formed into a light beam, which is guided to the illumination optical system 130.

As described above, the light source section 120 in the exposure apparatus 100 may generate EUV light, but the present embodiment is not limited to such a configuration. The light source section 120 used in the exposure apparatus 100 may be configured to output light having a different wavelength, such as grays (436 nm), i rays (365 nm), KrF excimer laser light (248 nm), $F_2$ laser light (157 nm), $Kr_2$ laser light (146 nm), or $Ar_2$ laser light (126 nm).

The illumination optical system 130 includes a pair of fly's eye reflector mirrors 134 and 136 and a planar reflector mirror 138. Each of the fly's eye reflector mirrors 134 and 136 includes a large number of concave reflector mirrors that are arranged on a single plane and have the same focal point. Being reflected by the fly's eye reflector mirrors 134 and 136, the light beam acquires a uniform illuminance distribution. This is because the reflected light rays from the concave reflector mirrors are superposed on each other.

The light reflected by the fly's eye reflector mirror 136 is incident on the planar reflector mirror 138 at a shallow angle and reflected towards a reticle 150. With the above-described configuration, the illumination optical system 130 virtually constitutes a surface light source with a uniform illuminance distribution.

The reticle 150 is held by a reticle stage 152 so that its reflective surface faces downwards. The reticle 150 may be formed by using a glass substrate or the like. The reticle 150 may have a reflecting layer formed by a multi-layer film and an absorbing layer covering part of the surface of the reflecting layer, for example.

The reflecting layer reflects EUV light. The absorbing layer absorbs EUV light. Accordingly, the light beam reflected by the reticle 150, which is incident on the projection optical system 160, has a pattern image with an illuminance distribution determined by the pattern of the absorbing layer.

Below the reticle 150, a pellicle 154 and a reticle blind 156 are arranged in the stated order. The pellicle 154 is formed by a very thin film and has optical characteristics such that it does not affect light that is incident on or emitted from the reticle 150.

The reticle blind 156 has an opening that surrounds the entire pattern region of the reticle 150, and prevents stray light, which does not contribute to exposure, from entering the projection optical system 160. In other words, the reticle blind 156 does not affect the beam shape of the light emitted from the illumination optical system 130 or the beam shape of the light entering the projection optical system. The reticle blind 156 may be formed by using, for example, a proximity blind as disclosed in Japanese Patent Application Publication No. 2005-108934.

The reticle blind 156 can be fixed to the reticle stage 152, for example. The reticle blind 156 may include two Y-direction blind plates movable in the scanning direction and two X-direction blind plates movable in a direction perpendicular to the scanning direction. Each blind plate can be placed such that the shadows of its edges are accommodated in a pinhole defect free region in a light-blocking belt-like area formed around the pattern region of the reticle. During exposure, the reticle blind 156 can be moved together with the reticle stage 152 while being fixed to the reticle 150.

None of the optical paths of the illumination optical system 130 have a member inserted therein that defines the shape of the light beam. Accordingly, the illumination optical system 130 does not require any relay optical systems to be inserted therein other than a fly's eye optical system. This feature curbs the number of reflecting surfaces in the exposure apparatus 100. As described above, in the exposure apparatus 100, the illumination optical system 130 includes a fly's eye optical system constituted by the fly's eye reflector mirrors 134 and 136. In this manner, primary images that are formed by the fly's eye optical system at positions optically conjugated with the reticle 150 may be superposed on each other in the illumination region on the reticle 150.

The projection optical system 160 includes a plurality of concave reflector mirrors 161, 164 and 166 and a plurality of convex reflector mirrors 162, 163 and 165. As a whole, the projection optical system 160 constitutes a minification optical system that makes the reflected light from the reticle 150 convergent. The concave reflector mirrors 161, 164 and 166 and the convex reflector mirrors 163 and 165 are each partially removed so as not to block the reflected light in the projection optical system 160.

As described above, in the exposure apparatus 100 with the light source section 120 that generates extreme ultraviolet light, the illumination optical system 130, the reticle 150 and the projection optical system 160 are each formed by using reflective optical members. In other words, the optical systems are formed without using transmissive optical members. In this way, the exposure apparatus 100 achieves exposure with the use of EUV light, which experiences enormous attenuation.

The light beam reflected by the reticle 150 is successively reflected by the reflector mirrors 161 to 166. The surface of a substrate 180, which is held on the upper surface of the substrate stage 182, is irradiated by the resultant light beam. The light beam by which the substrate 180 is irradiated has an intensity distribution patterned in accordance with the shape of the absorbing layer of the reticle 150. A photoresist sensitive to EUV light is applied onto the surface of the substrate 180.

Furthermore, the exposure apparatus 100 includes the field stop 170 arranged between the exposed surface of the substrate 180 and the projection optical system 160. The field stop 170 has an opening through which the light emitted from the projection optical system 160 passes. The opening is narrower than the light beam emitted from the projection optical system 160. The opening thus blocks part of the light beam and determines the width of an exposure region. Here, the distance between the field stop 170 and the substrate 180 can be varied by using a distance adjusting section 178.

The substrate stage 182 includes a driving section 190 that horizontally moves the substrate 180. As the substrate stage 182 moves, the substrate 180 held on the substrate stage 182 also moves. A similar driving section 192 may be provided for the reticle stage 152.

An exposure apparatus 100 having the above-described configuration can perform exposure while moving the reticle stage 152 and the substrate stage 182 in synchronization with each other. In the present embodiment, the exposure apparatus 100 repeats this procedure of scanning exposure and a procedure of moving the substrate 180 relative to the reticle 150 in steps. In other words, the exposure apparatus 100 employs the step and scan exposure technique. Alternatively, the exposure apparatus 100 may repeat a procedure of performing exposure while the reticle 150 and the substrate 180 are both kept stationary and a procedure of moving the reticle 150 and the substrate 180 in steps. In other words, the exposure apparatus 100 may employ the step and repeat exposure technique.

As described above, the substrate 180 may be exposed to light while moving in the scanning direction in the exposure apparatus 100. In this case, the collective reflector mirror 132 may reflect the light symmetrically with respect to a non-scanning direction that is substantially perpendicular to the scanning direction. The collective reflector mirror 132 may include a plurality of mirrors arranged symmetrically with respect to the non-scanning direction. Such a configuration can easily produce a collective reflector mirror 132 that has a larger reflective area.

As described above, the exposure apparatus 100 includes the illumination optical system 130 that guides the extreme ultraviolet light from the light source section 120 to the reticle 150, the projection optical system 160 that projects the pattern image formed by the reticle with the light from the illumination optical system 130 onto the substrate 180, the driving section 190 that moves the substrate 180 in the scanning direction, and the field stop 170 that is positioned between the projection optical system 160 and the substrate 180 and that has an opening designed to determine the width of the exposure region in the scanning direction of the light projected by the projection optical system 160.

Figure 2:
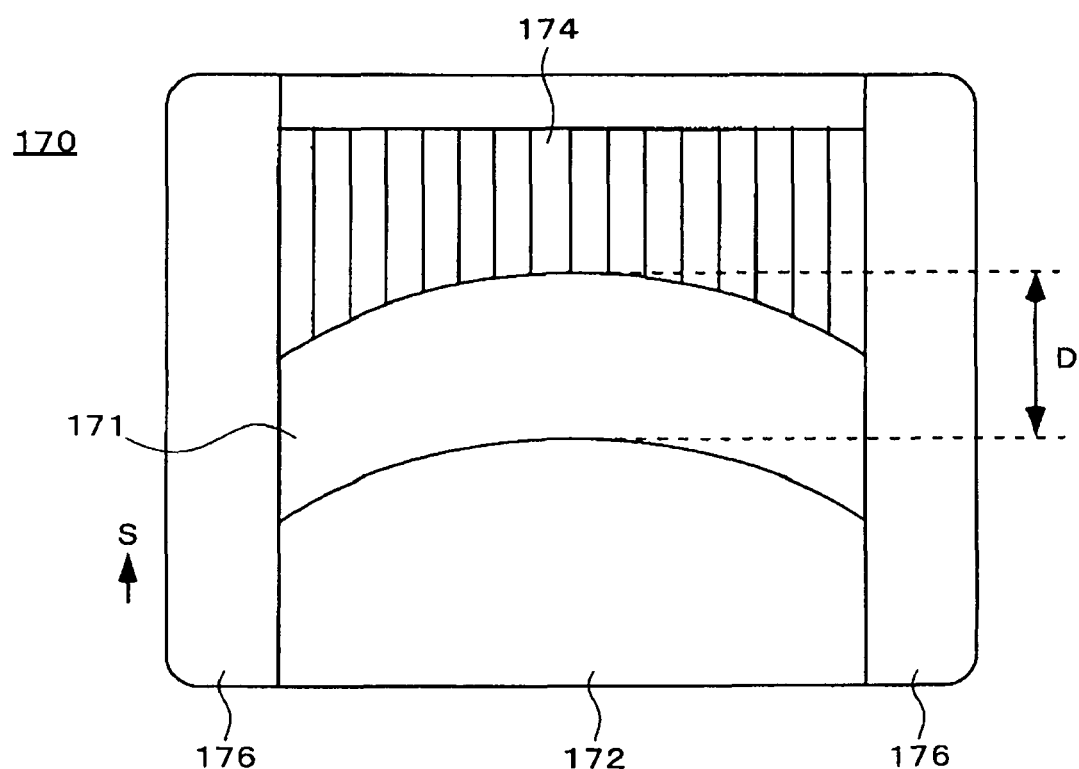
FIG. 2 schematically illustrates the shape of a field stop 170.

FIG. 2 schematically illustrates the shape of the field stop 170. The field stop 170 includes a substantially square frame 176, and a stop blade 172 and a sliding stop blade 174 that are arranged along the lower and upper edges of the frame in the drawing, respectively. The frame 176, the stop blade 172, and the sliding stop blade 174 together surround and define a scanning window 171.

The scanning window 171 is narrow in the scanning direction of the substrate 180, which is indicated by a narrow S in the drawing, and is wide in the direction perpendicular to the scanning direction. The front and back edges of the scanning window 171 in the scanning direction are curved so as to be convex in the scanning direction. The shape of the scanning window 171 is not limited to the curved shape shown but may be rectangular or the like.

The width D of the scanning window 171 is determined by the interval between the stop blade 172 and the sliding stop blade 174. The width D determines the width of the exposure light in the scanning direction. When the scanning window 171 is in the state shown in the drawing, the width D is constant.

The exposure light projected by the projection optical system 160 is projected onto the surface of the substrate 180 via the scanning window 171. The scanning window 171 is narrower than the light beam of the exposure light. The shape of the scanning window 171 determines the shape of the exposure light that is projected onto the substrate 180.

Figure 3:
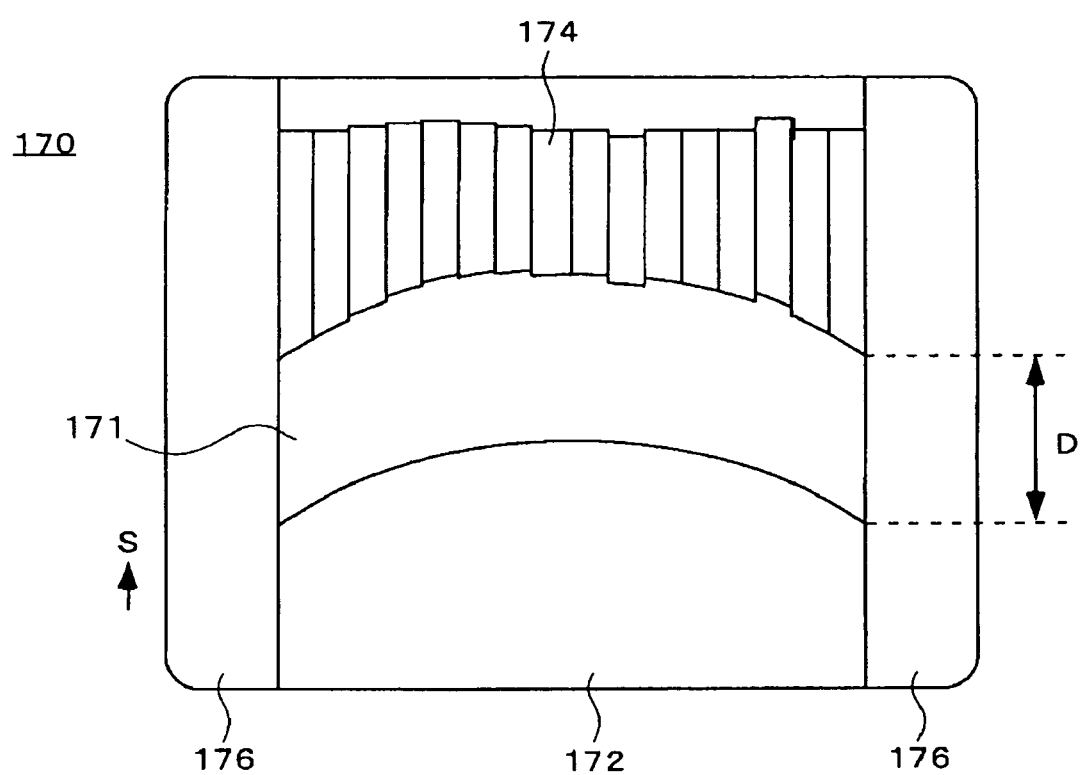
FIG. 3 is used to illustrate a function of changing a width D in association with each region.

FIG. 3 is a cross-sectional view used to illustrate the function of adjusting the exposure region by means of the field stop 170. The sliding stop blade 174, which partly defines the scanning window 171, is divided into a plurality of sections that are arranged along the direction perpendicular to the scanning direction, each defining a sectional region of the exposure region. Each section of the sliding stop blade 174 can be independently displaced in the scanning direction.

As shown in FIG. 3, the sections of the sliding stop blade 174 may be separately displaced in the scanning direction. In this manner, the scanning width D for each sectional region of the exposure region can be independently changed. As a result, the width D of the scanning window can be varied in association with each of the sectional regions defined by the widths of the sections of the sliding stop blade 174.

In the example shown in FIG. 3, the sliding stop blade 174 is positioned on the upper side in the drawing. However, the sliding stop blade 174 may be arranged on the lower side. As a further alternative example, sliding stop blades 174 may be provided on both the upper and lower sides of the field stop 170.

The two side edges, which are portions of the frame 176, may be also formed as stop blades 172 or sliding stop blades 174 that can be displaced. With such an alternative configuration, the dimensions of the scanning window 171 can be changed as desired.

The light source section 120 of the exposure apparatus 100 generates EUV light in the form of periodic pulse light. For this reason, when the surface of the substrate 180, moved by the driving section 190, is successively irradiated via the scanning window 171, the interval Z between the field stop 170 and the substrate 180 may fall within a range satisfying the relation given by the following Expression 1.

$$Z > V \times \cos(\arcsin(NA))/(2 \times NA \times f) \qquad \text{Expression 1}$$

In the above Expression 1, V denotes the moving speed of the substrate [m/sec], NA denotes the numerical aperture of the projection optical system, and f denotes the light emission frequency of the pulse light [Hz].

Figure 4:
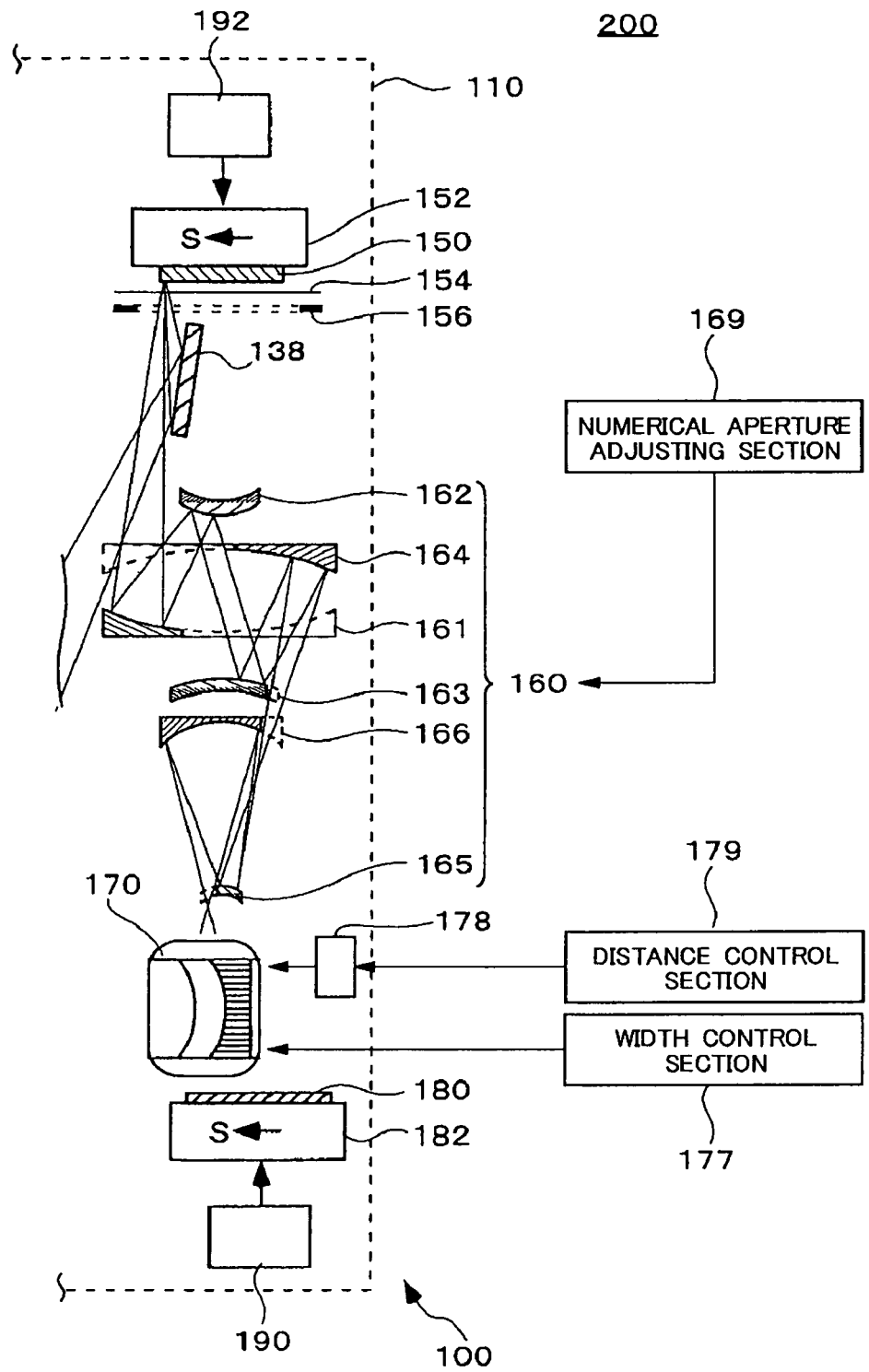
FIG. 4 schematically illustrates the configuration of a control system 200 for the exposure apparatus 100.

FIG. 4 schematically illustrates the configuration of a control system 200 for the exposure apparatus 100. The control system 200 includes a numerical aperture adjusting section 169, a width control section 177, and a distance control section 179.

The numerical aperture adjusting section 169 changes the numerical aperture of the projection optical system 160. In this manner, the numerical aperture of the projection optical system 160 is appropriately adjusted in accordance with the specifications of the reticle 150 and the substrate 180 used in the exposure apparatus 100. The projection optical system 160 may further include an optical characteristic correcting section, which is not shown, to correct optical characteristics such as image formation characteristics or wavefront aberration.

The width control section 177 displaces the sections of the sliding stop blade 174 of the field stop 170 when the driving section 190 moves the substrate 180, so that the integral value of the amount of light by which the substrate 180 is irradiated through each sectional region becomes the same. Also, the width control section 177 displaces the sections of the sliding stop blade 174 corresponding to the individual sectional regions so that the critical dimension of the pattern for each sectional region becomes the same.

The distance control section 179 controls the distance adjusting section 178 in accordance with the numerical aperture adjusted by the numerical aperture adjusting section 169, to change the interval Z between the field stop 170 and the substrate 180. In this manner, the substrate 180 can be exposed to light with the interval Z and the width D being set at appropriate values in accordance with the changed numerical aperture.

Information designated by a main controller that controls the entire exposure apparatus 100 or a server that is installed at a device manufacturing factory and controls a plurality of exposure apparatuses may be used to control the numerical aperture adjusting section 169 and the distance control section 179.

Figure 5:
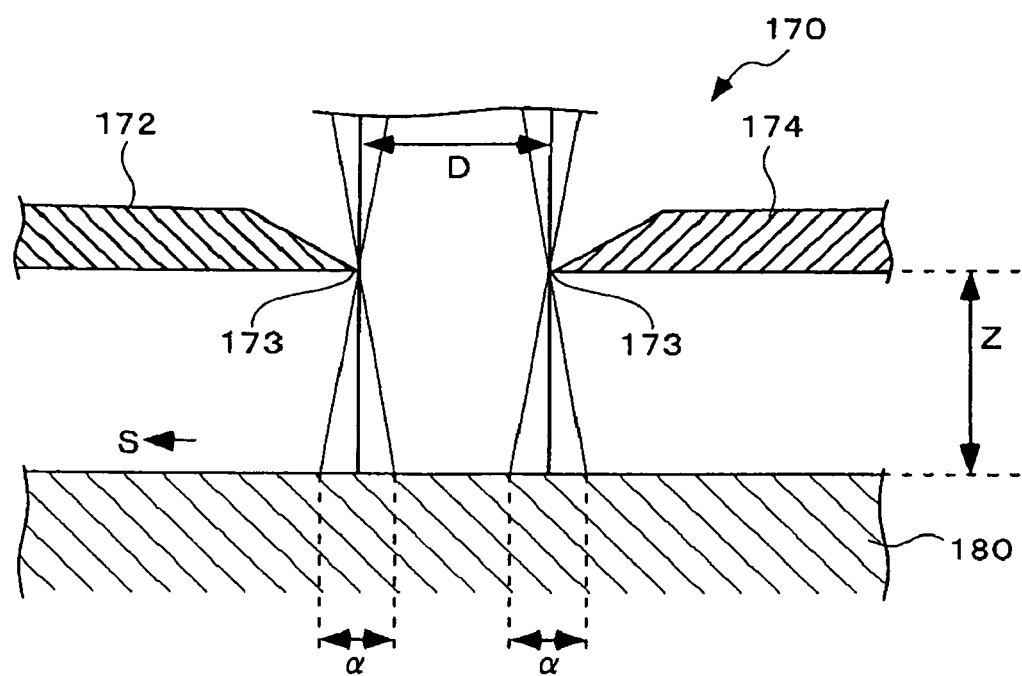
FIG. 5 is a cross-sectional view illustrating the function of the field stop 170.

FIG. 5 is a cross-sectional view illustrating the function of the field stop 170. In a cross-section parallel to the scanning direction, which is indicated by the arrow S in FIG. 5, the field stop 170 has acute-angle edges 173 along the scanning window 171. The acute-angle edges 173 are formed on the surface of the field stop 170 that faces the substrate 180. With such a configuration, the field stop 170 blocks the exposure light that enters the scanning window 171 at a single point, which gives an accurate shape to the exposure region.

Note that the light beam emitted from the projection optical system 160 has a certain width. Therefore, immediately below the acute-angle edges 173 are formed less exposure regions α in which the exposure light is reduced. These less exposure regions α obscure the boundary of the exposed region. In this way, even if the respective portions of the substrate 180 are sequentially exposed to light along the scanning direction, there is no clear difference in the amount of the exposed light. As a consequence, the entire substrate 180 can be exposed to light continuously and uniformly.

However, as the interval Z between the field stop 170 and the substrate 180 increases, the less exposure regions α increase. Eventually, the less exposure regions α cover the entire exposure region. Hence, the interval Z between the field stop 170 and the substrate 180 may fall within a range satisfying the following Expression 2.

When scanned with the use of the driving section 190, the substrate 180 may physically come into contact with the field stop 170. This collision may damage the substrate 180 and thus is not desirable. Therefore, it is best that the interval Z be larger than 0.1 mm taking into consideration the fabrication accuracy of the field stop 170 when the field stop 170 is formed by a metal material, for example.

For the above reasons, the interval Z between the field stop 170 and the substrate 180 may fall within a range satisfying the relation indicated by the following Expression 2.

$$0.1 < Z < D\mathrm{max}/(2 \times NA) \text{ [mm]} \qquad \text{Expression 2}$$

In the above Expression 2, Dmax [m] denotes the maximum width of the scanning window in the scanning direction, and NA denotes the numerical aperture of the projection optical system.

Figure 6:
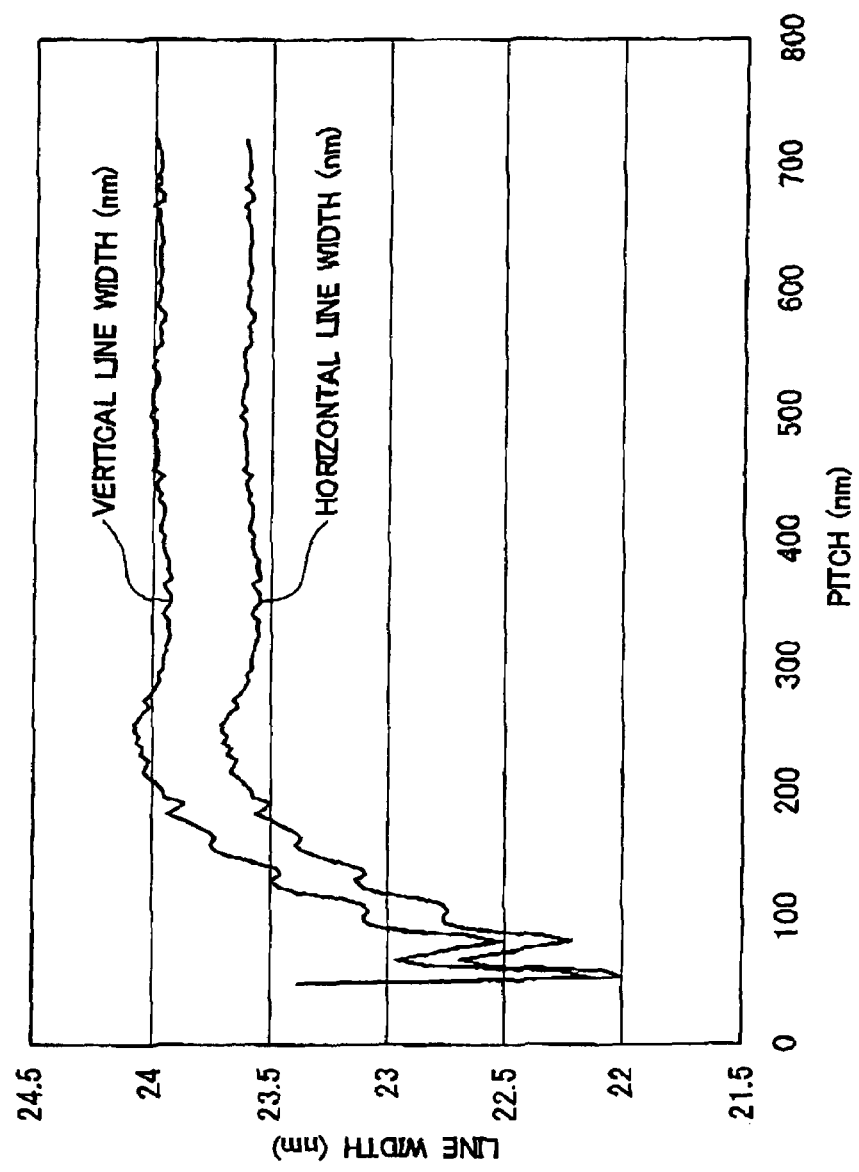
FIG. 6 is a graph illustrating optical proximity effect characteristics of the exposure apparatus 100.

FIG. 6 is a graph illustrating the optical proximity effect characteristics of the exposure apparatus 100. The exemplary graph shown in FIG. 6 plots the optical proximity effects produced when the exposure apparatus 100 having the configuration shown in FIG. 1 is used to form a line pattern having a line width of 24 nm at various pattern pitches. In this example, the numerical aperture of the projection optical system 160 was set to 0.25, the ratio in the numerical aperture between the illumination optical system 130 and the projection optical system 160 was set to 0.8, the wavelength of the EUV light generated by the light source section 120 was set to 13.5 nm, and the interval Z between the field stop 170 and the substrate 180 was set to 1 mm.

As seen from FIG. 6, a vertical line pattern and a horizontal line pattern with respect to the scanning direction exhibit different characteristics. This difference is attributed to degradation of illuminance in the vicinity of the boundary of the irradiation region parallel to the scanning direction. A small difference is desirable.

Accordingly, the interval Z between the field stop 170 and the substrate 180 may fall within a range satisfying the relation indicated by the following Expression 3. The lower limiting value of the range is chosen for the above-described reason.

$$0.1 < Z < D\mathrm{max}/(8 \times NA) \text{ [mm]} \qquad \text{Expression 3}$$

In the above Expression 3, Dmax[m] denotes the maximum width of the scanning window in the scanning direction, and NA denotes the numerical aperture of the projection optical system.

According to the above description, the distance between the field stop 170 and the exposed surface (the substrate 180) is variable in accordance with a change in the image-side (the wafer-side) numerical aperture of the projection optical system. However, the pattern density such as the pattern pitch may determine the numerical aperture of the light flux reaching the exposed surface. For this reason, the distance between the field stop 170 and the exposed surface (the substrate 180) may be configured to be variable in accordance with the characteristics of the pattern formed in the reticle 150 (for example, the pattern density such as the pattern pitch).

Figure 7:
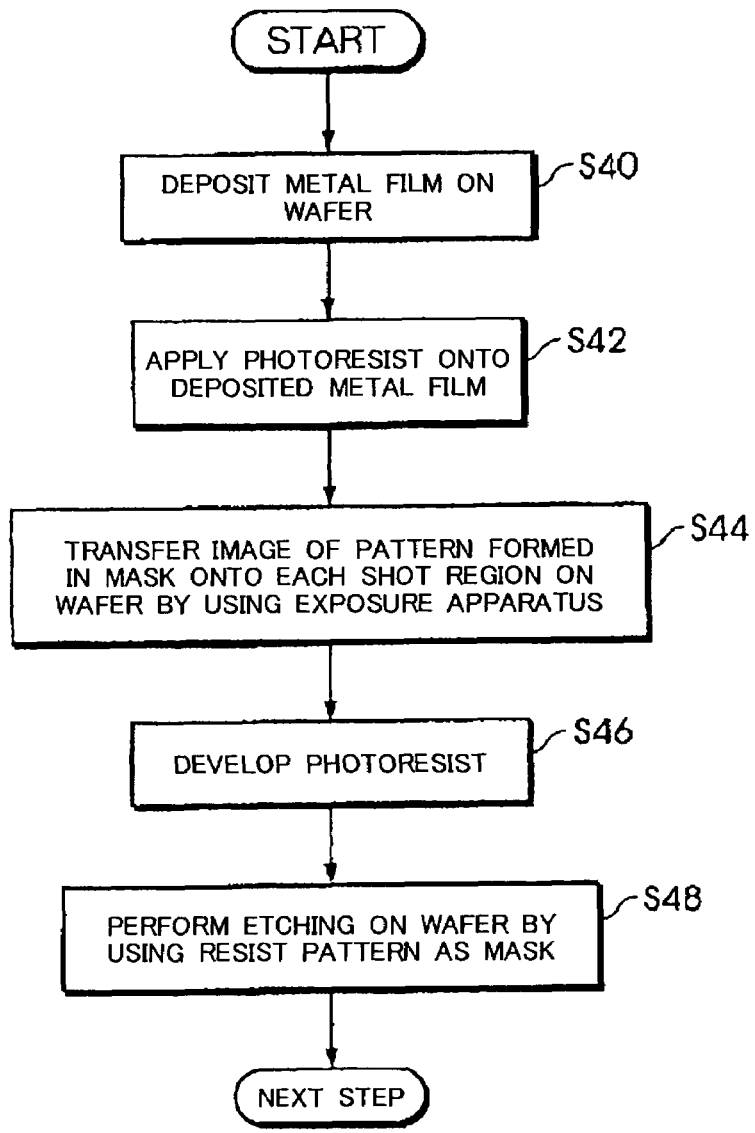
FIG. 7 is a flow chart illustrating an exemplary manufacturing method performed by using the exposure apparatus 100 including the light source section 120.

FIG. 7 is a flow chart illustrating a semiconductor device manufacturing method performed by using the exposure apparatus 100. According to this semiconductor device manufacturing method, a metal film is deposited on a wafer (substrate 180), which serves as a substrate of a semiconductor device to be manufactured (block S40). On the deposited metal film, a photoresist made of a photosensitive material is subsequently applied (block S42).

After this, an exposure block is performed by using the exposure apparatus 100. Specifically speaking, the pattern formed in the reticle 150 is transferred to each shot region on the wafer (substrate 180) (block S44). In other words, the photoresist applied onto the wafer (substrate 180) is irradiated by light whose intensity distribution is determined by the pattern. Thus, the photoresist is exposed to the light in accordance with the pattern.

Furthermore, a developing block is performed on the wafer (substrate 180) to which the pattern has been transferred in the exposure block. In other words, the photoresist is developed (block S46). The exposure block and a washing block form a resist pattern. The resist pattern is then used to perform processing such as etching on the surface of the wafer (substrate 180), the resist pattern allowing the desired pattern to be formed (block S48).

The resist pattern indicates a resist layer that is formed by keeping or removing some regions of the photoresist in accordance with the pattern transferred by the exposure apparatus 100 and that covers part of the surface of the wafer (substrate 180) in accordance with the pattern. In block S48, the resist pattern is used as a mask when the surface of the wafer (substrate 180) is processed. The processing performed on the wafer (substrate 180) may include, for example, etching of the surface of the wafer (substrate 180) or formation or etching of a metal film or the like.

As described above, the present embodiment realizes an electronic device manufacturing method including a block of guiding the light from the light source section 120 to the reticle 150 by using the illumination optical system 130, a block of projecting the image of the pattern of the reticle 150 onto the substrate 180 by using the projection optical system 160, a block of moving the substrate 180 in the scanning direction by using the driving section 190, a block of determining the exposure region width D of the light projected by the projection optical system 160 in the scanning direction by using the scanning window 171, a block of exposing the substrate 180, which is arranged on the exposed surface, to the light from the projection optical system 160, a block of developing the substrate 180 onto which a pattern is transferred and forming on the surface of the substrate 180 a layer shaped in accordance with a predetermined pattern, and a block of processing the surface of the substrate 180 by using the layer.

Figure 8:
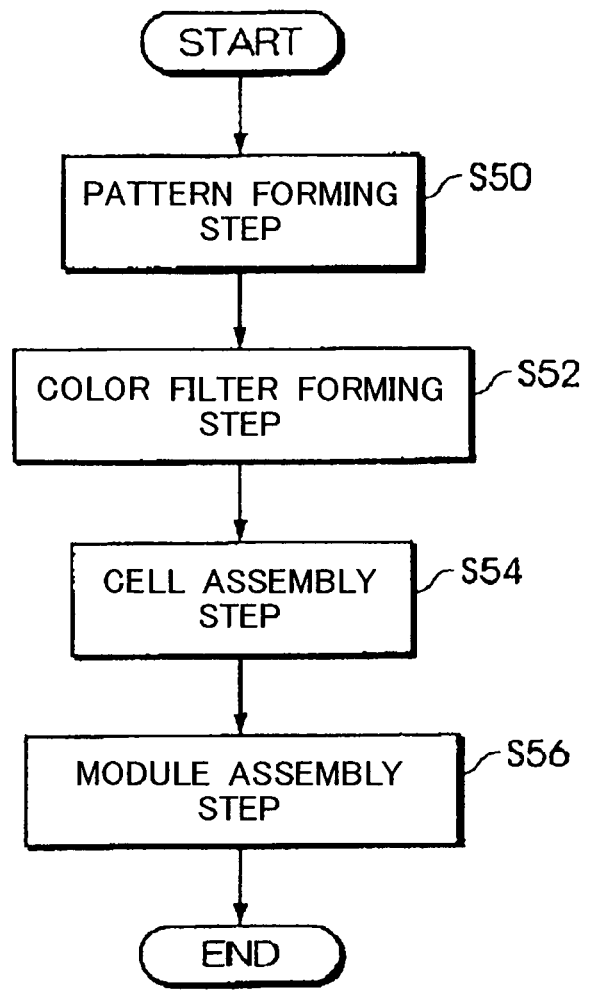
FIG. 8 is a flow chart illustrating another exemplary manufacturing method performed by using the exposure apparatus 100 including the light source section 120.

FIG. 8 is a flow chart illustrating a manufacturing method of a liquid crystal device such as a liquid crystal display element, performed by using the exposure apparatus 100. The liquid crystal device manufacturing method sequentially performs a pattern forming block (block S50), a color filter forming block (block S52), a cell assembly block (block S54), and a module assembly block (block S56).

In block S50, a predetermined pattern is formed on a plate P by using an exposure apparatus 100. Here, the plate P is formed by applying a photoresist onto a glass substrate, and the predetermined pattern includes a circuit pattern, an electrode pattern and the like. The pattern forming block includes an exposure block of transferring a pattern onto the photoresist layer by using the exposure apparatus 100, a developing block of developing the plate P onto which the pattern has been transferred, in other words, developing the photoresist layer on the glass substrate to shape the photoresist layer in accordance with the pattern, and a processing block of processing the surface of the glass substrate by means of the developed photoresist layer.

In block S52, a large number of sets of three dots corresponding to R (red), G (green) and B (blue) are arranged in a matrix, or a large number of sets of three stripe filters R, G and B are arranged so as to be adjacent to each other in the horizontal scan direction, in order to form a color filter.

In block S54, a liquid crystal panel (a liquid crystal cell) is assembled by using the glass substrate in which the predetermined pattern is formed in block S50 and the color filter formed in block S52. Specifically speaking, liquid crystal is injected between the glass substrate and the color filter to form the liquid crystal panel, for example.

In block S56, the liquid crystal panel assembled in block S54 is provided with an electrical circuit designed to cause the liquid crystal panel to perform a display operation and a variety of components including a back light.

Use of the above-described light source apparatus, exposure apparatus and manufacturing method is not limited to the manufacturing process of semiconductor devices. For example, the above-described light source apparatus, exposure apparatus and manufacturing method can be widely applied to manufacture a variety of devices such as liquid crystal display elements, plasma display elements, imaging elements (for example, CCDs), micro electro mechanical systems, thin-film magnetic heads, and DNA chips. In addition, the above-described light source apparatus, exposure apparatus and manufacturing method can be used to manufacture masks (photomasks, reticles and the like) having mask patterns of a variety of devices formed therein by using the photolithography technique.

According to the above-described embodiments, the exposure apparatus 100 is formed by using reflective optical members. However, similar effects can be produced even when transmissive (refractive) optical members are used, by disposing the field stop 170 between the projection optical system 160 and the substrate 180.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using terms such as "first" and "next" for the sake of convenience. This, however, does not necessarily indicate that the operations should be performed in the explained order.

What is claimed is:

1. An exposure apparatus comprising:
   a projection optical system configured to project a pattern image onto a substrate;
   a driving section configured to hold the substrate and move the substrate in a scanning direction;
   a numerical aperture adjusting section configured to change a numerical aperture of the projection optical system; and
   a block section that is disposed between the projection optical system and the substrate, a position of the block section in a direction of the optical axis of the projection optical system being determined based on the numerical aperture;
   wherein the block section includes a scanning window configured to determine a width, in the scanning direction, of an exposure region exposed to light projected by the projection optical system.

2. The exposure apparatus as set forth in claim 1, further comprising a pattern forming section configured to form a pattern of the pattern image projected by the projection optical system.

3. The exposure apparatus as set forth in claim 2, wherein at least one of the pattern forming section and the projection optical system have reflective optical members.

4. The exposure apparatus as set forth in claim 1, wherein along the scanning window, the block section has an acute-angle edge having an acute-angled cross-section, and
   the acute-angle edge is formed on a surface of the block section that faces the substrate.

5. The exposure apparatus as set forth in claim 1, wherein a front or back edge of the scanning window in the scanning direction is curved so as to be convex in the scanning direction.

6. The exposure apparatus as set forth in claim 1, further comprising
   a distance adjusting section that is connected to the block section, the distance adjusting section configured to change a distance between the block section and the substrate.

7. The exposure apparatus as set forth in claim 6, further comprising a distance control section configured to change the distance between the block section and the substrate by controlling the distance adjusting section in accordance with the numerical aperture.

8. The exposure apparatus as set forth in claim 1, wherein the block section further includes:
   a plurality of members that are arranged in association with sectional regions adjacent to each other in a non-scanning direction that is substantially perpendicular to the scanning direction; and
   a width adjusting section that is connected to the plurality of members and that changes a width of the scanning window in the scanning direction.

9. The exposure apparatus as set forth in claim 8, further comprising a width control section that controls the width adjusting section when the driving section moves the substrate, such that an integral value of an amount of light to which the substrate is exposed through each of the sectional regions becomes the same.

10. The exposure apparatus as set forth in claim 1, wherein the light is periodic pulse light, and
    the block section is positioned such that a distance Z between a surface of the block section including the scanning window and the substrate satisfies a relation indicated by $$Z > V \times \cos(\arcsin(NA))/(2 \times NA \times f),$$

where V denotes a moving speed of the substrate, NA denotes a numerical aperture of the projection optical system, and f denotes a light emission frequency of the pulse light.

11. The exposure apparatus as set forth in claim 1, wherein the block section is positioned such that a distance Z between a surface of the block section including the scanning window and the substrate satisfies a relation indicated by $$0.1 < Z < D\text{max}/(2 \times NA),$$

where Dmax denotes a maximum width of the scanning window in the scanning direction, and NA denotes a numerical aperture of the projection optical system.

12. The exposure apparatus as set forth in claim 11, wherein the block section is positioned such that the distance Z between the surface of the block section including the scanning window and the substrate satisfies a relation indicated by $$0.1 < Z < D\text{max}/(8 \times NA),$$

where Dmax denotes the maximum width of the scanning window in the scanning direction, and NA denotes the numerical aperture of the projection optical system.

13. The exposure apparatus as set forth in claim 1, further comprising:
a pattern forming section configured to form a pattern of the pattern image projected by the projection optical system; and
an illumination optical system that includes a reflective fly's eye optical system, the illumination optical system guiding the light to the pattern forming section, wherein primary images that are formed by the reflective fly's eye optical system at positions optically conjugated with the pattern forming section are superposed on each other in an illumination region on the pattern forming section.

14. The exposure apparatus as set forth in claim 1, wherein the light is extreme ultraviolet light.

15. An electronic device manufacturing method comprising:
projecting a pattern image onto a substrate by using a projection optical system;
moving the substrate in a scanning direction by using a driving section;
changing a numerical aperture of the projection optical system;
determining a width, in the scanning direction, of an exposure region exposed to light projected by the projection optical system by causing the light projected by the projection optical system to pass through a scanning window that is disposed between the projection optical system and the substrate;
determining a position of the scanning window in a direction of the optical axis of the projection optical system based on the numerical aperture;
exposing the substrate to the light from the projection optical system;
developing the substrate onto which the pattern is transferred by the exposure and forming on a surface of the substrate a layer shaped in accordance with the pattern; and
processing the surface of the substrate by using the layer.

16. The electronic device manufacturing method as set forth in claim 15, wherein the light is extreme ultraviolet light.

17. The electronic device manufacturing method as set forth in claim 15, further comprising changing a distance between a block section that defines the width of the exposure region and the substrate, in accordance with the numerical aperture.

18. The electronic device manufacturing method as set forth in claim 15, wherein the determining a width includes determining a width of the scanning window in the scanning direction in association with each of sectional regions adjacent to each other in a non-scanning direction that is substantially perpendicular to the scanning direction.

19. The electronic device manufacturing method as set forth in claim 18, wherein the width of the scanning window in the scanning direction is determined in association with each of the sectional regions such that a pattern for each of the sectional regions has the same critical dimension.

20. The electronic device manufacturing method as set forth in claim 18, wherein the width of the scanning window in the scanning direction is determined in association with each of the sectional regions such that an integral value of an amount of light to which each of the sectional regions is exposed becomes the same.

21. An exposure method comprising:
projecting a pattern image onto a substrate by using a projection optical system;
moving the substrate in a scanning direction by using a driving section;
changing a numerical aperture of the projection optical system;
determining a width, in the scanning direction, of an exposure region exposed to light projected by the projection optical system by causing the light projected by the projection optical system to pass through a scanning window that is disposed between the projection optical system and the substrate;
determining a position of the scanning window in a direction of the optical axis of the projection optical system based on the numerical aperture; and
exposing the substrate to the light from the projection optical system.

22. The exposure method as set forth in claim 21, further comprising varying a distance between the scanning window and the substrate in accordance with a characteristic of a pattern of the pattern image.

23. The exposure method as set forth in claim 21, wherein the light is extreme ultraviolet light.

24. The exposure method as set forth in claim 21, further comprising changing a distance between a block section that defines the width of the exposure region and the substrate, in accordance with the adjusted numerical aperture.

25. The exposure method as set forth in claim 21, wherein the determining a width includes determining a width of the scanning window in the scanning direction in association with each of sectional regions adjacent to each other in a non-scanning direction that is substantially perpendicular to the scanning direction.

26. The exposure method as set forth in claim 25, wherein the width of the scanning window in the scanning direction is determined in association with each of the sectional regions such that a pattern for each of the sectional regions has the same critical dimension.

27. The exposure method as set forth in claim 25, wherein the width of the scanning window in the scanning direction is determined in association with each of the sectional regions such that an integral value of an amount of light to which each of the sectional regions is exposed becomes the same.

* * * * *